(12) United States Patent
Chen et al.

(10) Patent No.: US 7,826,275 B2
(45) Date of Patent: Nov. 2, 2010

(54) MEMORY CIRCUIT WITH HIGH READING SPEED AND LOW SWITCHING NOISE

(75) Inventors: Yung-Hsu Chen, Hsinchu (TW);
Chun-Yu Liao, Taichung (TW);
Chia-Jung Chen, Zhubei (TW);
Fu-Nian Liang, Lujhou (TW)

(73) Assignee: Macronix International Co., Ltd., Hsin-Chu (TW)

( * ) Notice: Subject to any disclaimer, the term of this patent is extended or adjusted under 35 U.S.C. 154(b) by 92 days.

(21) Appl. No.: 11/953,161

(22) Filed: Dec. 10, 2007

(65) Prior Publication Data
US 2009/0147591 A1 Jun. 11, 2009

(51) Int. Cl.
*G11C 16/04* (2006.01)
(52) U.S. Cl. .................. 365/189.05; 365/189.09; 365/189.06; 365/189.11
(58) Field of Classification Search .................
365/189.05–189.09, 189.11, 63, 72; 327/211, 327/203
See application file for complete search history.

(56) References Cited

U.S. PATENT DOCUMENTS

| 4,992,677 | A | | 2/1991 | Isibashi et al. | |
| 5,442,307 | A | * | 8/1995 | Shigehara et al. | 327/437 |
| 6,522,596 | B2 | * | 2/2003 | Gillingham et al. | 365/189.05 |
| 6,906,965 | B2 | * | 6/2005 | Cioaca | 365/189.05 |
| 7,254,061 | B2 | * | 8/2007 | Nam et al. | 365/185.17 |
| 7,391,250 | B1 | * | 6/2008 | Chuang | 327/211 |
| 7,447,110 | B2 | * | 11/2008 | Chae | 365/233.13 |

* cited by examiner

*Primary Examiner*—David Lam
(74) *Attorney, Agent, or Firm*—Volpe and Koenig PC

(57) ABSTRACT

A memory circuit with relatively high reading speed and relatively low switching noise is provided. The memory circuit includes an output buffer device having a first input receiving a data signal having a first voltage level, a second input receiving a pre-set voltage having a second voltage level and an output outputting the data signal, and a pre-set circuit constructed by a pair of MOSFETs and providing the pre-set voltage to the second input before the output buffer device receives the data signal. The pre-set circuit receives a control signal activating the pair of MOSFETs at the same time, and when the output buffer device receives the data signal, a voltage level of the second input is swung from the second level to the first voltage level.

16 Claims, 4 Drawing Sheets

MEMORY CIRCUIT WITH HIGH READING SPEED AND LOW SWITCHING NOISE

FIELD OF THE INVENTION

The present invention relates to a memory circuit, and more particularly to a memory circuit with high reading speed and low switching noise.

BACKGROUND OF THE INVENTION

Many integrated digital systems, such as memory circuits, are provided with a plurality of output buffers for processing and/or handling the output of digital data streams. Nevertheless, there usually exists a problem that in the case where data are outputted, a noise issue will always occur due to the internal resistive drop and/or inductive effects in the output paths. Further, during the phase change of the output signals, the switching noise problem is particularly intense. When the voltage level in an output terminal of the output buffers is changed from a logic high level to a logic low level, or from the logic low level to the logic high level, the output buffer will absorbs a relatively large current to change the external load capacitance. This causes a noise spike that will slow down the transmission of the signal inside the memory circuit and may cause errors.

In order to overcome the above-mentioned issues, a well-known proposal is to preset the voltage in the output buffers to an intermediate voltage level before outputting the signal. In such a manner, the current flown the output buffer and the voltage discrimination level will be reduced, and therefore the reading speed will be increased and the switching noise will be decreased.

U.S. Pat. No. 4,992,677 discloses a pre-set circuit presetting the output terminal at a certain intermediate voltage level before outputting the signal. Please refer to FIG. 1, which shows an equivalent circuit of the pre-set circuit according to the prior art. As shown in FIG. 1, the pre-set circuit 10 includes a first MOSFET 11 and a second MOSFET 12 connected in series, a first differential amplifier 15 and a second differential amplifier 16, which are electrically connected to the first and the second MOSFETs 11, 12 and supplied with a first reference voltage 17, and a second reference voltage 18, respectively. The first MOSFET 11 is further electrically connected to a supply voltage 2, and the second MOSFET 12 is further electrically connected to a ground 3 in order to provide the potential controlling the flow direction of the current. With such circuit, when an output terminal 1 between the first and the second MOSFETs 11, 12 has an output voltage, Vo, higher than the second reference voltage 18, the second MOSFET 12 will be activated and a current iL will flow from the output terminal to the ground for lowering the output voltage to a level of the second voltage 18; while the output voltage is lower than the first reference voltage 17, the first MOSFET 11 will be activated and a current iH will flow from the supply voltage to the output terminal for raising the output voltage to a level of the first voltage 17.

According to the descriptions in the U.S. Pat. No. 4,992,677, although the MOSFETs 11, 12 of the pre-set circuit 10 can be constructed by the NMOSFETs, bipolar transistor or constructed by combining an NMOSFET and a PMOSFET, it still exists some drawbacks. For example, no matter what kinds of transistors are used, only one MOSFET will be activated during the operation of the pre-set circuit. As a result, the pre-set circuit 10 according to the prior art inevitably needs two differential amplifiers as the comparators, and needs two reference voltages for controlling the operations of the respective transistor electrically connected to the comparator. Nevertheless, if more components are used in the pre-set circuit, the layout area of the pre-set circuit will be increased, and the layout of the circuitry will be more complicated. Further, the cost for fabricating such pre-set circuit will also be more expensive. Therefore, it is necessary to develop a novel memory circuit with a pre-set circuit for increasing the reading speed and decreasing the switching noise thereof.

SUMMARY OF THE INVENTION

In accordance with an aspect of the present invention, a memory circuit is provided. The memory circuit includes a first tri-state buffer being supplied with a data signal having a first voltage level and transmitting the data signal through a first load line when being switched on, a second tri-state buffer electrically connected to the first load line for receiving the data signal and outputting the data signal when being switched on, and a pre-set circuit including an NMOSFET and a PMOSFET and providing a pre-set voltage having a second voltage level to the first load line before the first tri-state buffer is switched on, wherein the pre-set circuit receives a control signal activating the NMOSFET and the PMOSFET at the same time, and when the first tri-state buffer is switched on, a voltage level of the first load line is swung from the second voltage level to the first voltage level.

Preferably, the NMOSFET is electrically connected to a supply voltage, and the PMOSFET is electrically connected to a ground.

Preferably, the control signal is supplied to the NMOSFET through an inverter but supplied to the PMOSFET without the inverter, so that the PMOSFET and the NMOSFET are activated by the control signal at the same time.

Preferably, the pre-set circuit outputs the pre-set voltage from an output node between the PMOSFET and the NMOSFET, and the second voltage level is equal to half of the supply voltage.

Preferably, the first and the second tri-state buffers are selected from a group consisting of transmission gates, pull up/pull down tri-state buffers, cascade tri-state buffers.

Preferably, the first load lines are selected from a group consisting of MOSFETs, routing lines, capacitors, and resistors.

Preferably, the second tri-state buffer is further connected to a solid power through a second load line.

In accordance with a further aspect of the present invention, a memory circuit with relatively high reading speed and relatively low switching noise is provided. The memory circuit includes an output buffer device having a first input receiving a data signal having a first voltage level and a second input receiving a preset voltage having a second voltage level, and a pre-set circuit including a pair of MOSFETs and providing the pre-set voltage to the second input before the output buffer device receives the data signal, wherein the pre-set circuit receives a control signal activating the pair of MOSFETs at the same time, and when the output buffer device receives the data signal, a voltage level of the second input is swung from the second level to the first voltage level.

Preferably, the pre-set circuit is a MOSFET cascade circuit, and the pair of MOSFETs are configured by an NMOSFET and a PMOSFET electrically connected in series.

Preferably, the output buffer device further includes a first and a second tri-state buffers connected in series and the second input is configured there between.

In accordance with a further aspect of the present invention, a novel memory circuit is provided. The memory circuit includes a tri-state buffer supplied with a data signal having a first voltage level and outputting the data signal through an output load line when being switched on, and a pre-set circuit including a pair of MOSFETs and providing a pre-set voltage having a second voltage level to the output load line before the tri-state buffer is switched on, wherein the pre-set circuit receives a control signal activating the pair of MOSFETs at the same time, and when the tri-state buffer is switched on, a voltage level at the output load line is swung from the second level to the first voltage level.

Preferably, the tri-state buffer outputs the data signal through a further tri-state buffer electrically connected to a solid power.

BRIEF DESCRIPTION OF THE DRAWINGS

The above objects and advantages of the present invention will become more readily apparent to those ordinarily skilled in the art after reviewing the following detailed descriptions and accompanying drawings, in which.

DETAILED DESCRIPTION OF THE PREFERRED EMBODIMENT

The present invention will now be described more specifically with reference to the following embodiments. It should be noted that the following descriptions of preferred embodiments of this invention are presented herein for purposes of illustration and description only; it is not intended to be exhaustive or to be limited to the precise form disclosed.

Figure 1:
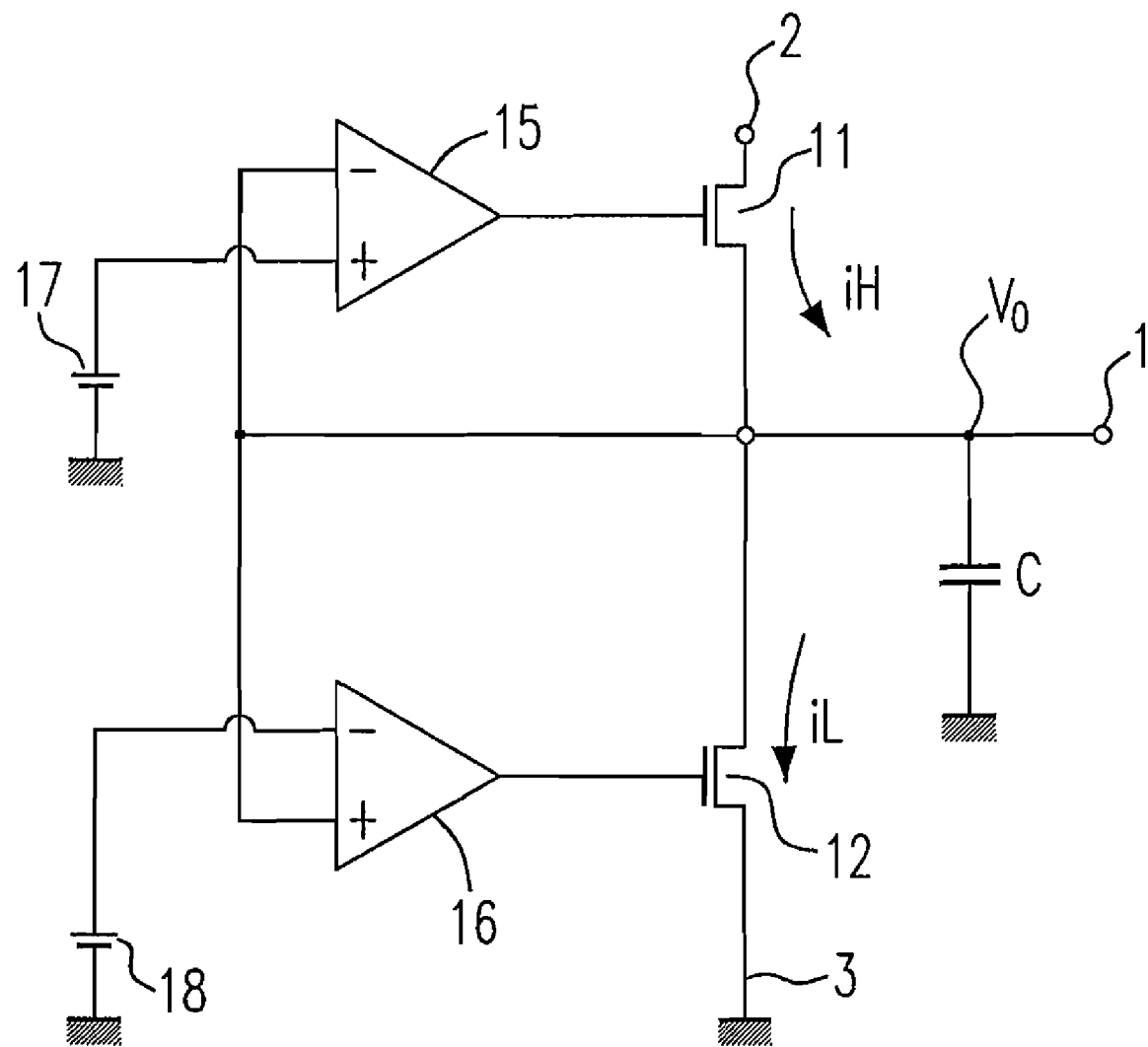
FIG. 1 is a diagram showing an equivalent circuit of a pre-set circuit according to the prior art.
Figure 2:
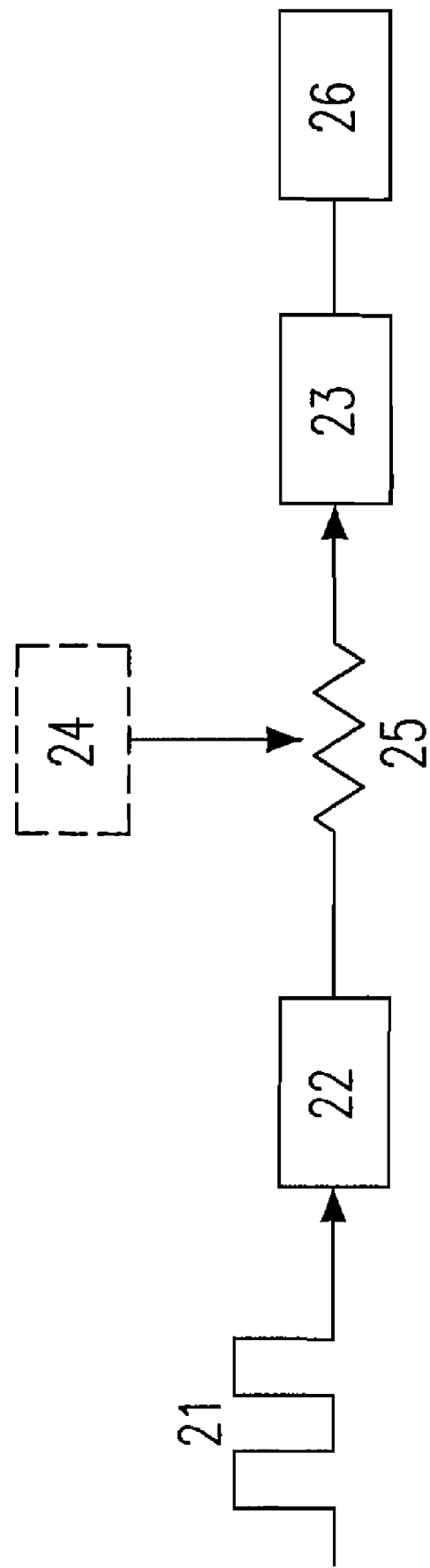
FIG. 2 is a block diagram showing a preferred embodiment of a memory circuit according to the present invention.

Please refer to FIG. 2, which shows a block diagram illustrating a preferred embodiment of a memory circuit according to the present invention. As shown in the FIG. 2, when a digital data signal 21 is transmitted from a tri-state buffer 22 to another tri-state buffer 23, the voltage drop occurring in a transmission path 25 between the tri-state buffer 22 and the tri-state buffer 23, especially during the phase change of the digital data signal 21, will result in a noise spike and slow down the transmission of the digital data signal 21, as mentioned in background of invention of the present specification. In order to overcome such issues, a pre-set circuit 24 is configured to provide a pre-set voltage to the transmission path 25. As a result, the voltage variation at the transmission path 25 during the phase change of the digital data signal 21 will be decreased and the transmission delay issue and the switching noise issue can be mitigated. Further, in order to prevent the later tri-state buffer 23 from consuming much power to drive the output load line (not shown) of the tri-state buffer 23 when the tri-state buffer 23 is switched on, the tri-state buffer 23 is further electrically connected to a solid power 26, such that the DC current occurring in the tri-state buffer 23 and/or its output load line will be decreased.

Figure 3:
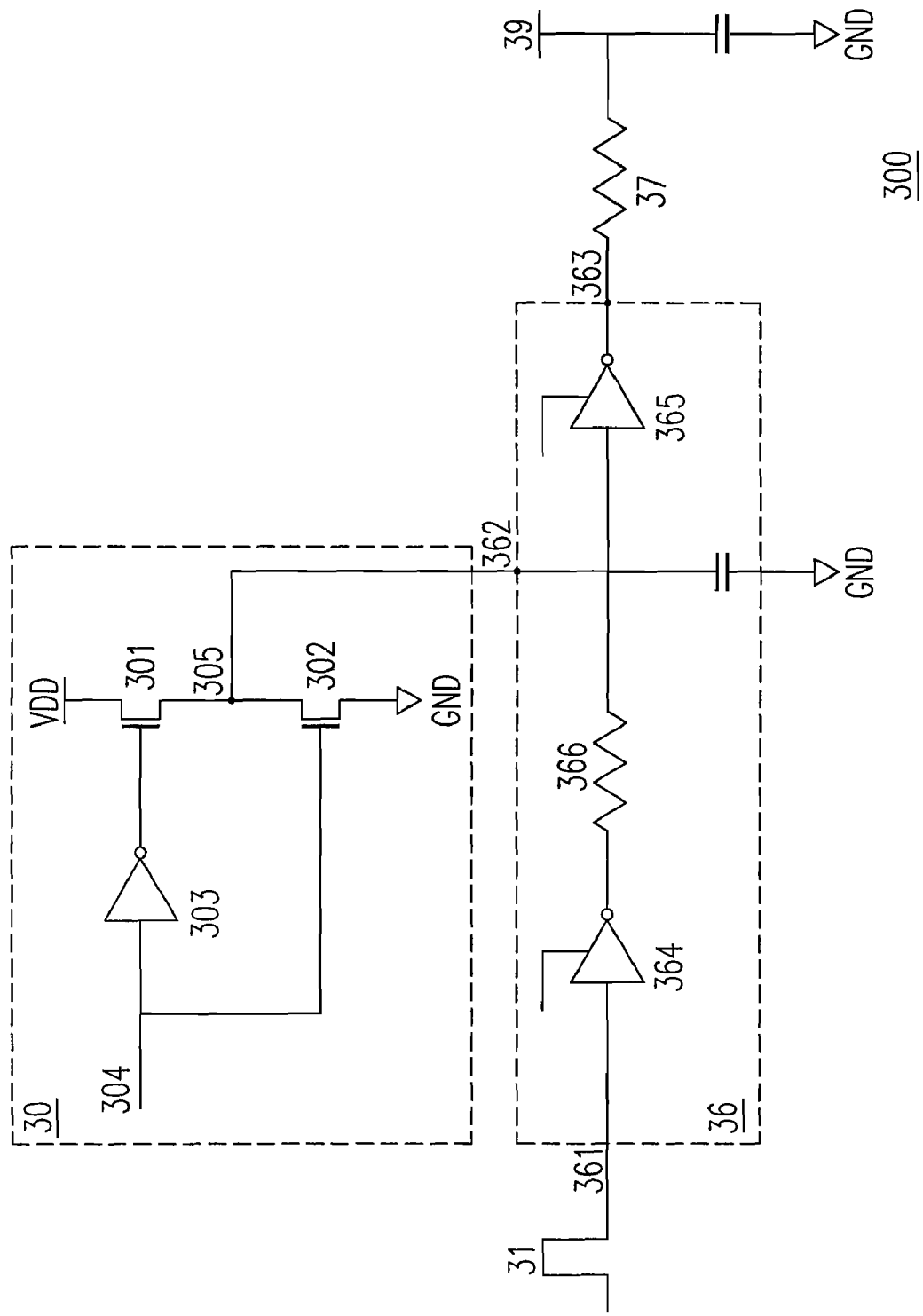
FIG. 3 is a diagram showing an equivalent circuit of the memory circuit according to a preferred embodiment of the present invention.

Please further refer to FIG. 3, which shows an equivalent circuit of the memory circuit according to an embodiment of the present invention. As can be seen from FIG. 3, the memory circuit 300 according to the embodiment of the present invention includes an output buffer device 36 having a first input 361 receiving a data signal 31 having a first voltage level, a second input 362 receiving a pre-set voltage having a second voltage level and an output 363 outputting the data signal. The memory circuit 300 is further configured with a pre-set circuit 30 including a pair of MOSFETs 301, 302 and providing the pre-set voltage from an output node 305 between the pair of MOSFETs 301, 302 to the second input 362 of the output buffer device 36 before the output buffer device 36 receives the data signal. Specifically, the pre-set circuit 30 is a MOSFET cascade circuit, and the pair of MOSFETs 301, 302 are configured by an NMOSFET 301 and a PMOSFET 302 electrically connected in series. Further, the NMOSFET 301 is electrically connected to a supply voltage, VDD, and the PMOSFET is electrically connected to a ground, GND. The pre-set circuit 30 also has an input 304 receiving a control signal for activating the pair of MOSFETs 301, 302, at the same time, wherein the control signal is supplied to the NMOSFET 301 through an inverter 303 but supplied to the PMOSFET 302 without the inverter, so that the PMOSFET 302 and the NMOSFET 303 are activated by the control signal at the same time. With such a configuration of the pre-set circuit, the pre-set circuit can outputs the pre-set voltage having the second voltage level from the output node 305 between the PMOSFET 302 and the NMOSFET 301 to the second input 362 of the output buffer device 36, and such second voltage level of the pre-set voltage can be equal to half of the supply voltage when the PMOSFET 302 and the NMOSFET 301 are activated at the same time.

On the other hand, the output buffer device 36 includes a first and a second tri-state buffers 364, 365 connected in series and the second input 362 of the output buffer device 36 is configured there between. Further, the transmission path between the first and the second tri-state buffers 364, 365 could have an equivalent resistance, which can be represented as a load line 366 disposed between the two tri-state buffers 364, 365. Since the second input 362 of the output buffer device 36 and the load line 366 are disposed between the two tri-state buffers 364, 365, when the pre-set voltage is outputted from the pre-set circuit to the second input 362, the voltage level at the load line 366 is also preset to an voltage level equal to what the second input has. Therefore, when the output buffer device 36 receives the data signal 31, i.e. when the first tri-state buffer 364 is switched on, the voltage level at the second input 362 (or at the load line 366) is swung from the voltage level of the pre-set voltage to the voltage level of the data signal. In addition, the output buffer device outputs the data signal through the output 363 electrically connected to the second tri-state buffer 365. Nevertheless, there similarly exists an equivalent resistance represented as an output load line 37 for consuming the power driving the data signal therethrough. In particular, during the operation of the output buffer device 36, the voltage level that will occur at the output 363 is unknown before switching on the second tri-state buffer 365. Therefore, in order to prevent the second tri-state buffer 365 from consuming much power to drive the output load line 37 upon the tri-state buffer 365 is switched on, a solid power 39 is further electrically connected to the output load line 37 for decreasing the current occurring in the output load line 37. Specifically, the solid power can be selected from the voltage level equal to the data signal, i.e. the solid power can has a voltage level as one of a logic high and a logic low.

In a further embodiment of the present invention, the above-mentioned first and the second tri-state buffers are selected from a group consisting of transmission gates, pull-up/pull-down tri-state buffers, cascade tri-state buffers, and the load line disposed between the two tri-state buffers or the one connected to the output of the output buffer device is selected from a group consisting of MOSFETs, routing lines, capacitors, and resistors.

Figure 4:
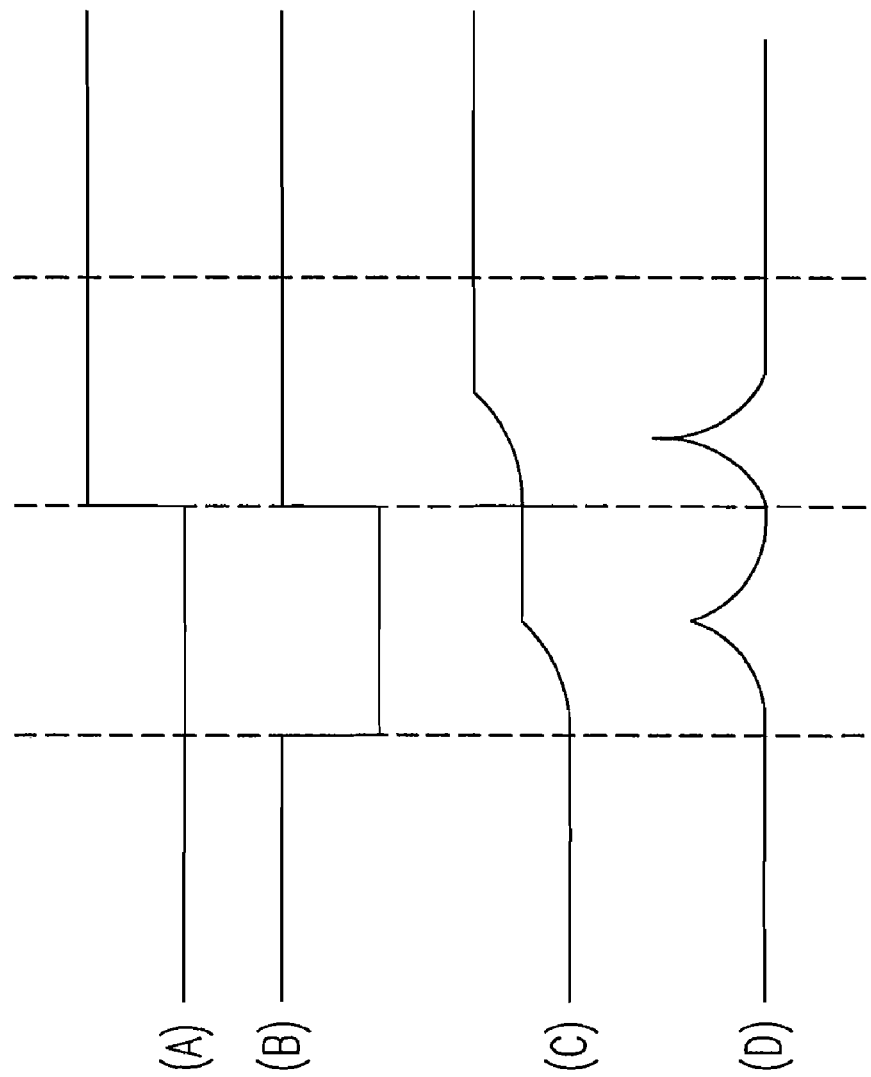
FIG. 4 is a waveform diagram illustrating the respective waveforms of the voltage detected in the input of the first tri-state buffer, the input of the pre-set circuit and the output load line of the first tri-state buffer, and a waveform of the power consumed in the output load line of the first tri-state buffer.

Please refer to FIG. 4, which schematically shows the respective waveforms of the voltage detected in the input of the first tri-state buffer, the input of the pre-set circuit and the output load line of the first tri-state buffer, and a waveform of the power consumed in the output load line of the first tri-state buffer. As can be seen from FIG. 4, before the first tri-state buffer is activated, i.e. before the first waveform (A) in FIG. 4, is raised from a logic low to a logic high, a pulse signal is generated in the second waveform (B) in FIG. 4, which means the control signal is supplied to the first and the second MOSFET in the pre-set circuits for switching on both of them and generating the pre-set voltage to the load line of the first tri-state buffer, as denoted by reference numeral 366 in FIG. 3. At the same time, when the pre-set circuit is activated, the voltage level at the load line of the first tri-state buffer (or the further input of the output buffer device, as denoted by reference numeral 362 in FIG. 3) is raised from a relatively low level to a voltage level equal to the pre-set voltage, as shown in the third waveform (C) in FIG. 4. Further, when the first tri-state buffer is activated, i.e. when the waveform (A) is raised from the logic low to the logic high, the pre-set circuit is deactivated (as shown in the waveform (B)) and the voltage level at the load line of the first tri-state buffer is further raised from the voltage level, which is equal to the pre-set voltage, to a further level equal to the data signal, as shown in waveform (C) in FIG. 4. It should be noted that the data signal also might have a voltage level in logic low. In such case, the voltage level at the load line of the first tri-state buffer might be swung from the pre-set voltage level to a lower voltage level equal to what the data signal has. Nevertheless, the operation procedure will be similar.

As to the fourth waveform (D) in FIG. 4, it is illustrated that the power consumption occurring at the load line of the first tri-state buffer. As shown in the fourth waveform (D) in FIG. 4, each time the voltage variation occurs in the load line of the first tri-state buffer, different levels of power consumption will happen. The level of the power consumption is dependent on the voltage variation occurring in the load line and the transition time for changing the voltage level. In this case, the power consumption occurs twice, i.e. at the time the voltage level of the load line is raised from a logic low state to a pre-set voltage state, and at the time the voltage level of the load line is further raised from a pre-set voltage state to a data signal state. Nevertheless, if the voltage of the load line is raised from a logic low state to the data signal state directly without an intermediate state preset by the pre-set circuit, the peak of the power consumption will be raised sharply, which might result in the serious switching noise and cause an error on the transmission of the data signal. Therefore, if the pre-set circuit is incorporated, the issues of the power consumption will be greatly mitigated.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A memory circuit, comprising:
   a first tri-state buffer being supplied with a data signal having a first voltage level and transmitting the data signal through a first load line when being switched on;
   a second tri-state buffer electrically connected to the first load line for receiving the data signal and outputting the data signal when being switched on; and
   a pre-set circuit including an NMOSFET and a PMOSFET, and providing a pre-set voltage having a second voltage level to the first load line before the first tri-state buffer is switched on,
   wherein the pre-set circuit receives a control signal activating the NMOSFET and the PMOSFET at a same time, and when the first tri-state buffer is switched on, a voltage level of the first load line is swung from the second voltage level to the first voltage level.

2. A memory circuit according to claim 1, wherein the NMOSFET is electrically connected to a supply voltage, and the PMOSFET is electrically connected to a ground.

3. A memory circuit according to claim 2, wherein the pre-set circuit outputs the pre-set voltage from an output node between the PMOSFET and the NMOSFET, and the second voltage level is equal to half of the supply voltage.

4. A memory circuit according to claim 1, wherein the control signal is supplied to the NMOSFET through an inverter but supplied to the PMOSFET without the inverter, so that the PMOSFET and the NMOSFET are activated by the control signal at the same time.

5. A memory circuit according to claim 1, wherein the first and the second tri-state buffers are selected from a group consisting of transmission gates, pull-up/pull-down tri-state buffers, cascade tri-state buffers.

6. A memory circuit according to claim 1, wherein the first load lines is selected from a group consisting of MOSFETs, routing lines, capacitors, and resistors.

7. A memory circuit according to claim 1, wherein the second tri-state buffer is further connected to a solid power through a second load line.

8. A memory circuit, comprising:
   a tri-state buffer supplied with a data signal having a first voltage level and outputting the data signal through an output load line when being switched on; and
   a pre-set circuit including a pair of MOSFETs and providing a pre-set voltage having a second voltage level to the output load line before the tri-state buffer is switched on,
   wherein the pre-set circuit receives a control signal activating the pair of MOSFETs at a same time, and when the tri-state buffer is switched on, a voltage level at the output load line is swung from the second voltage level to the first voltage level.

9. A memory circuit according to claim 8, wherein the tri-state buffer outputs the data signal through a further tri-state buffer electrically connected to a solid power.

10. An output buffer circuit, comprising:
    a pre-set circuit having a first transistor and a second transistor coupled to a first terminal of the first transistor; and
    an output buffer device having a first tri-state buffer and a second tri-state buffer coupled in series through the first terminal of the first transistor configured therebetween.

11. An output buffer circuit according to claim 10, wherein the first transistor and the second transistor are a pair of MOSFETs configured by an NMOSFET and a PMOSFET electrically connected in series.

12. An output buffer circuit according to claim 11, wherein the NMOSFET is electrically connected to a supply voltage, and the PMOSFET is electrically connected to a ground.

13. An output buffer circuit according to claim 12, wherein the pre-set circuit outputs a pre-set voltage having a first voltage level equal to half of the supply voltage and generated from the first terminal.

14. An output buffer circuit according to claim 13, wherein the output buffer device has a second terminal configured at an upstream side of the first and the second tri-state buffers and receiving a data signal having a second voltage level, and the first terminal has a voltage level swung from the first voltage level to the second voltage level when the output buffer device receives the data signal from the second terminal.

15. An output buffer circuit according to claim 11, wherein a control signal is supplied to the NMOSFET through an inverter and directly supplied to the PMOSFET, so that the PMOSFET and the NMOSFET are activated by the control signal at the same time.

16. An output buffer circuit according to claim 10, wherein the first and second tri-state buffers are selected from a group consisting of transmission gates, pull-up/pull-down tri-state buffers and cascade tri-state buffers.

* * * * *